United States Patent [19]

Kataoka et al.

[11] 3,766,372

[45] Oct. 16, 1973

[54] METHOD OF CONTROLLING HIGH ELECTRIC FIELD DOMAIN IN BULK SEMICONDUCTOR

[75] Inventors: Shoei Kataoka; Hiroshi Tateno, both of Tokyo; Mitsuo Kawashima, Tokorosawa; Yasuo Komamiya, Yokohama; Michitada Morisue, Urawa; Nobuo Hashizume, Tokyo, all of Japan

[73] Assignee: Agency of Industrial Science & Technology, Tokyo, Japan

[22] Filed: May 14, 1971

[21] Appl. No.: 143,418

[30] Foreign Application Priority Data

May 18, 1970 Japan ............................... 45/41634
May 18, 1970 Japan ............................... 45/41636
Dec. 16, 1970 Japan ............................. 45/111835

[52] U.S. Cl. ............ 235/175, 317/234 V, 307/216, 307/218, 340/347 DD

[51] Int. Cl. ............................................ G06f 7/385

[58] Field of Search ................ 235/175; 317/234 V; 307/216, 218; 340/347 DD

[56] References Cited

UNITED STATES PATENTS

| | | | |
|---|---|---|---|
| 3,599,000 | 8/1971 | Yanai et al. | 317/234 V |
| 3,452,222 | 6/1969 | Masakazu | 307/218 X |
| 3,587,000 | 6/1971 | Heeks | 317/234 V |
| 3,434,008 | 3/1969 | Sandbank | 317/234 V |
| 3,579,143 | 5/1971 | Haydl | 317/234 V |
| 3,555,282 | 1/1971 | Yanai et al. | 317/234 V |
| 3,621,306 | 11/1971 | Schickle | 307/218 X |
| 3,594,618 | 7/1971 | Hartnagel | 307/218 X |
| 3,482,331 | 12/1969 | Gazale | 340/347 DD |
| 3,293,634 | 12/1966 | Teitel | 340/347 DD |

OTHER PUBLICATIONS

Hayashi, "Three Terminal GaAs Switches," IEEE Trans. On Elec. Devices, Ed. 15, No. 2, Feb. 1968.

Chang, "Semiconductor Bulk Effect Full Adder Circuit," IBM Tech. Disc. Bulletin, Vol. 12 No. 1, June 1969.

*Primary Examiner*—Eugene G. Botz
*Assistant Examiner*—James F. Gottman
*Attorney*—Kurt Kelman

[57] ABSTRACT

The invention disclosed is for a method and apparatus for controlling high electric field domain in a bulk semiconductor as well as an information processing method thereby. By means of a capacitive electrode, the high electric field domain may be either sustained or extinguished.

26 Claims, 60 Drawing Figures

INVENTORS
SHOEI KATAOKA
HIROSHI TATENO
MITSUO KAWASHIMA
YASUO KOMAMIYA
MICHITADA MORISUE
NOBUO NASHIZUME
BY
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT

INVENTORS

SHOEI KATAOKA
HIROSHI TATENO
MITSUO KAWASHIMA
YASUO KOMAMIYA
MICHITADA MORISUE
NOBUO HASHIZUME

BY

Kurt Kelman
AGENT

INVENTORS
SHOEI KATAOKA
HIROSHI TATENO
MITSUO KAWASHIMA
YASUO KOMAMIYA
MICHITADA MORISUE
NOBUO HASHIZUME

BY Kurt Kelman
AGENT

SHOEI KATAOKA
HIROSHI TATENO
MITSUO KAWASHIMA
YASUO KOMAMIYA
MICHITADA MORISUE
NOBUO HASHIZUME
INVENTORS

BY Kurt Kelman
AGENT

INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT

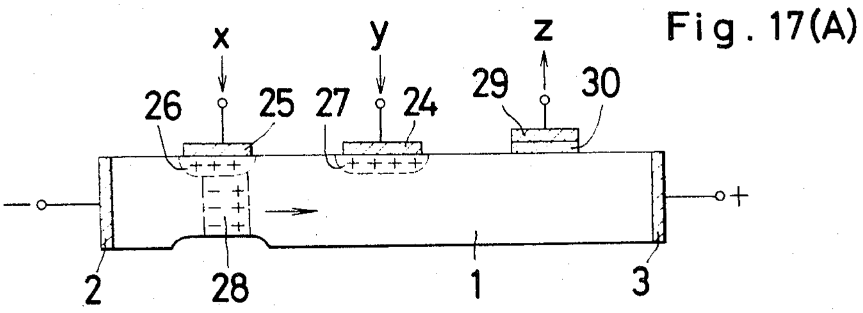
Fig. 17(A)
Fig. 17(B)
| x | y | z |
|---|---|---|
| 0 | 0 | 0 |
| 1 | 0 | 0 |
| 0 | 1 | 0 |
| 1 | 1 | 1 |
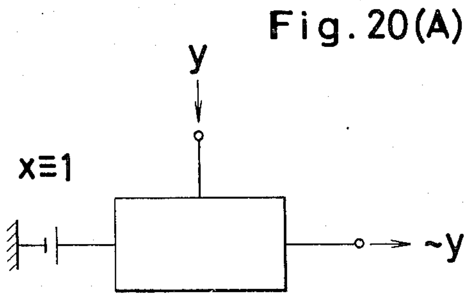
Fig. 20(A)
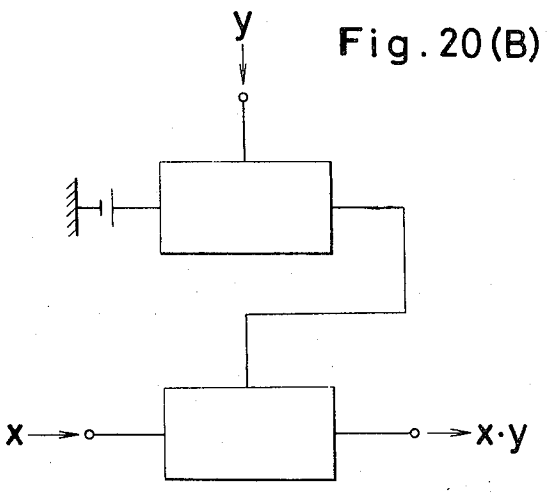
Fig. 20(B)
INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT Fig.18(A)
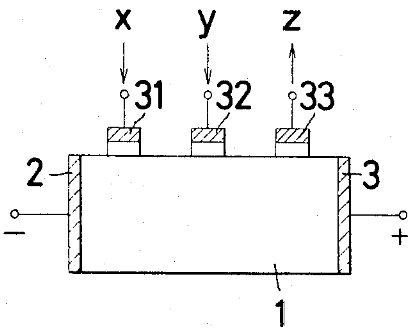
Fig.19(A)
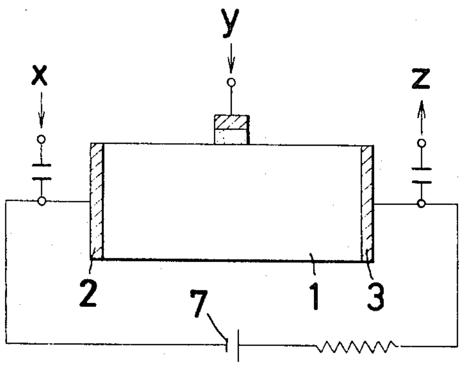
Fig.18(B)
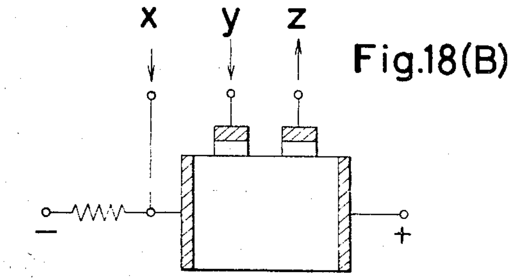
Fig.19(B)
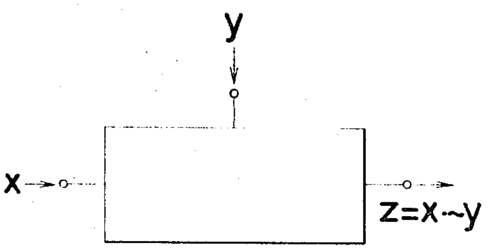
Fig.18(C)
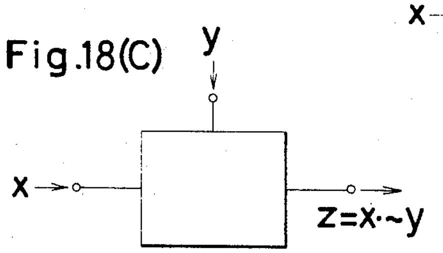
Fig.19(C)
| x | y | z |
|---|---|---|
| 0 | 0 | 0 |
| 0 | 1 | 0 |
| 1 | 0 | 1 |
| 1 | 1 | 0 |
Fig.18(D)
| x | y | z |
|---|---|---|
| 0 | 0 | 0 |
| 0 | 1 | 0 |
| 1 | 0 | 1 |
| 1 | 1 | 0 |
INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME
BY
Kurt Kelman
AGENT

INVENTORS

SHOEI KATAOKA
HIROSHI TATENO
MITSUO KAWASHIMA
YASUO KOMAMIYA
MICHITADA MORISUE
NOBUO HASHIZUME

BY

Kurt Kelman
AGENT

INVENTORS
SHOEI KATAOKA
HIROSHI TATENO
MITSUO KAWASHIMA
YASUO KOMAMIYA
MICHITADA MORISUE
BY NOBUO HASHIZUME
Kurt Kelman
AGENT INVENTORS
SHOEI KATAOKA
HIROSHI TATENO
MITSUO KAWASHIMA
YASUO KOMAMIYA
MICHITADA MORISUE
NOBUO HASHIZUME BY Kurt Kelman
AGENT

PATENTED OCT 16 1973 3,766,372

SHEET 18 OF 18

INVENTORS
SHOBI KATAOKA
HIROSHI TATENO
MITSUO KAWASHIMA
YASUO KOMAMIYA
MICHITADA MORISUE
NOBUO HASHIZUME

BY Kurt Kelman
AGENT

METHOD OF CONTROLLING HIGH ELECTRIC FIELD DOMAIN IN BULK SEMICONDUCTOR

This invention relates to a method of controlling high electric field domain in a bulk semiconductor element and an information processing method thereby.

It is known that a high electric field domain which is formed by an electric dipole layer supported by space charges is produced in a bulk semiconductor element such as GaAs, InP or the like, which presents a negative differential conductivity at high electric field, when a voltage higher than a threshold value is applied across the element and that the domain thus generated usually in the vicinity of the negative side of the element travels toward the positive side thereof. This phenomenon is referred to as the Gunn effect and the element providing such effect is used as an oscillator for micro-wave. The mechanism of such negative differential conductivity under high electric field is thought to be such that the conduction band of the semiconductor has at least two valleys in the energy structure and electrons transfer from the lower valley providing a high mobility to the higher valley providing a lower mobility when the applied electric field is increased beyond the threshold value. The speed at which the high electric field domain develops corresponds to the dielectric relaxation time of the semiconductor and is very high reaching up to between $10^{-11}$ and $10^{-12}$ seconds. Although the size of the high electric field domain varies with the external voltage conditions, it ranges from 1 to 100 microns and the travelling velocity of the high electric field domain in GaAs is of the order of $10^7$ cm/sec.

There are several conventional methods of generating a high electric field domain in such a bulk semiconductor element. One method consists in providing a cathode electrode and an anode electrode at opposite ends of a semiconductor element having a negative differential conductivity and applying a voltage across the electrodes in such a manner that the applied voltage can be raised beyond the threshold value of the semiconductor element to thereby generate a high electric field domain in the vicinity of the cathode. Another method consists in providing, in addition to the pair of electrodes a third electrode on the semiconduction element between the two electrodes, applying a bias voltage across the two electrodes in such a manner that the bias voltage biases the two electrodes so that the difference in potential between the two is slightly smaller than the threshold voltage of the semiconductor, and applying a second positive voltage by closing a switch to the third electrode so that the electric field between the cathode and the third electrode becomes higher than the threshold field strength to be produced by the threshold voltage to thereby cause a high electric field domain to be generated in the vicinity of the cathode. Further, there is another method in which a third electrode is provided on a semiconductor element having on the oppositing ends thereof an anode electrode and a cathode electrode. The third electrode is provided by means of P-N junction, Schottky junction or metal contact through an insulating material etc. When a negative voltage is applied from a source to the third electrode, an electron depletion layer is generated in the semiconductor element so that the path of the current flow is narrowed to make the electric field strength in that portion higher than the threshold value to thereby generate a high electric field domain in the vicinity of the third electrode which is removed from the cathode electrode.

So far, technical studies concerning the bulk semiconductor have been directed mainly to methods of generating a high electric field domain and little attention has been paid to how to extinguish the domain.

A primary object of the present invention is to provide a method of extinguishing a high electric field domain and by combining the present method with a method of generating a domain, a novel method of processing information at very high speed can be provided. Therefore, the providing of a novel method for processing information at very high speed is another object of the present invention.

Because conventional semiconductor elements for use in information processing have P-N junction structure, the capacitance of the P-N junction of the element limits the operation speed. Further, as the logical operations are carried out by circuits containing a plurality of such semiconductor elements each acting as a switch, the operation speed is determined by the sum of these operation times and thus considerable time is required in, for example, the addition of multi-digit numbers.

However, by generating and extinguishing a high electric field domain at any desired position in a semiconductor using external electrical signals in accordance with the present invention and by causing a plurality of the domains to co-exist in the semiconductor, complicated logic operations can be performed at very high speed with a device of very simple construction.

It is the property of the high electric field domain in a bulk semiconductor that the high electric field domain is generated only when the applied electric field is at or higher than a doamin generating threshold electric field (3.2 kv/cm for GaAs). However, once such domain is generated, it is sustained even when the applied field becomes lower than the generating threshold level and it is extinguished only when the applied field is lowered to below the sustaining electric threshold field (about 1.6 kv/cm for GaAs).

Accordingly, in order to extinguish a domain, the electric field in the semiconductor must be lowered below the sustaining threshold value. Further, since a domain is formed as an electrical dipole layer, the domain can be extinguished by neutralizing the electrical charges in the dipole layer.

Other objects and advantages of the present invention will be apparent from the following description of preferred embodiments of the present invention with reference to the drawing.

Figure 6:
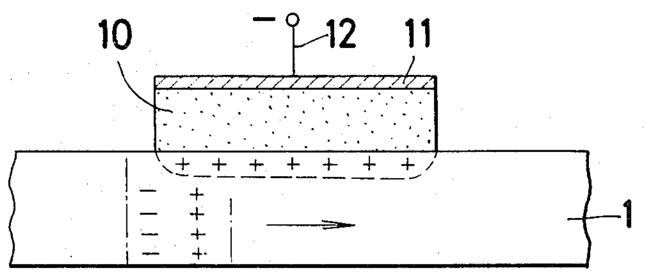
Figure 7:
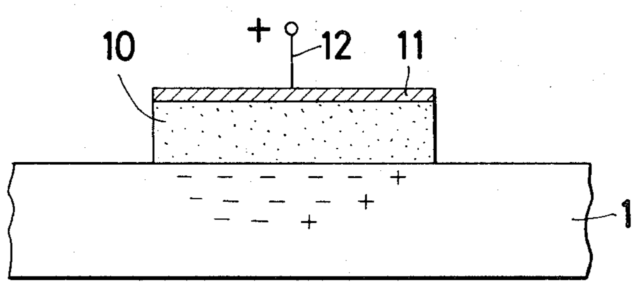
Figure 8:
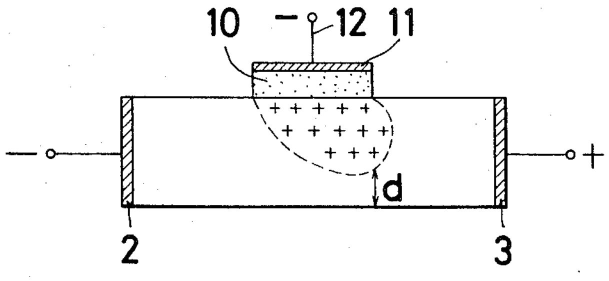
Figure 9A:
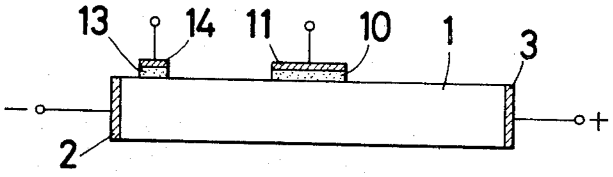
Figure 9C:
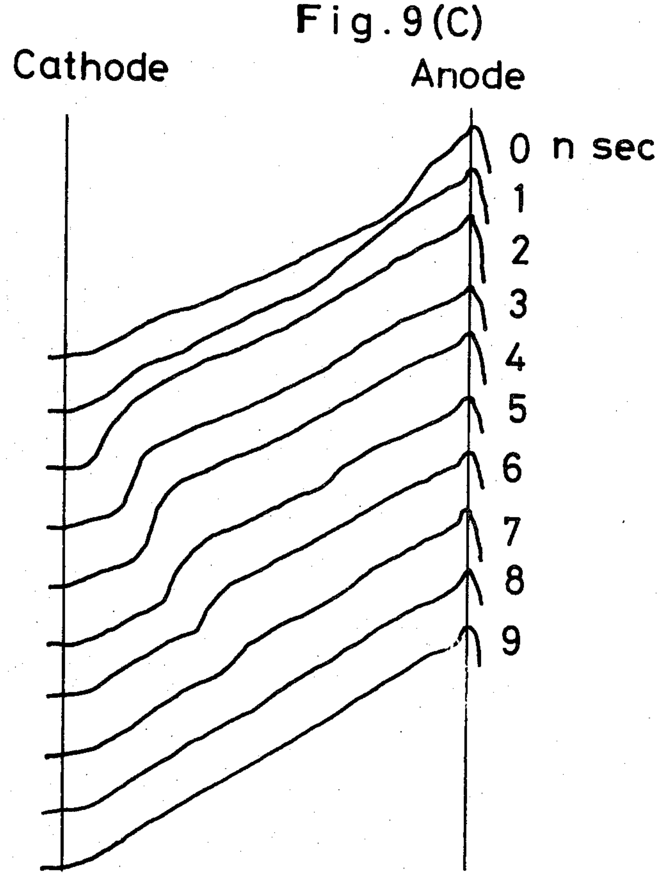
Figure 9B:
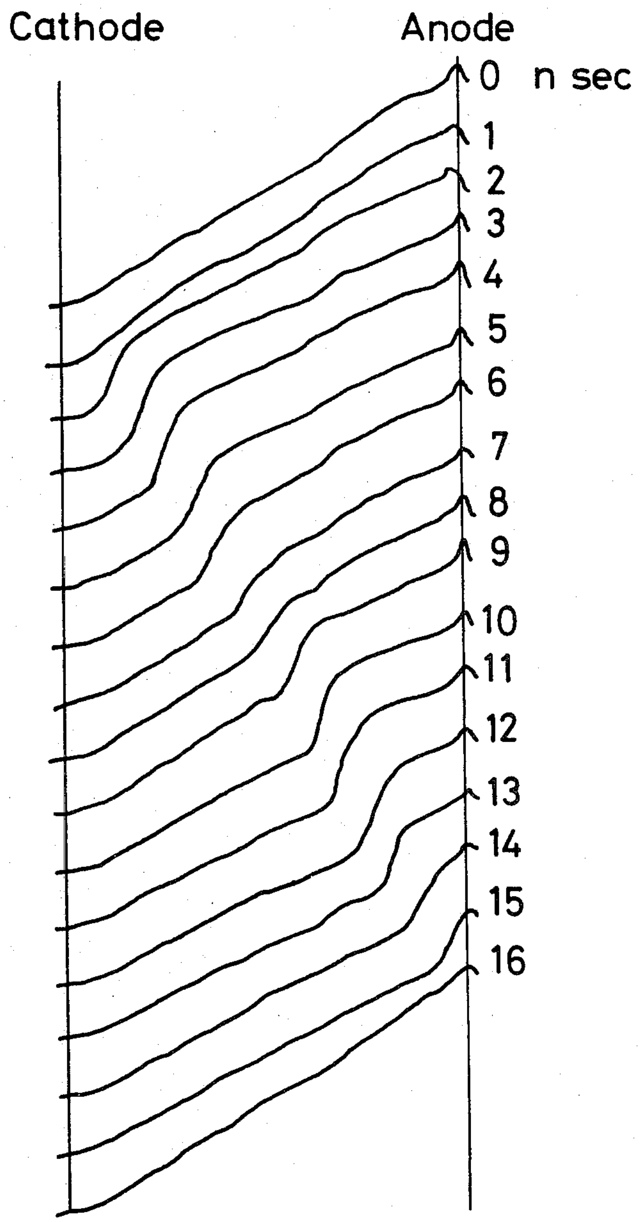
Figure 14A:
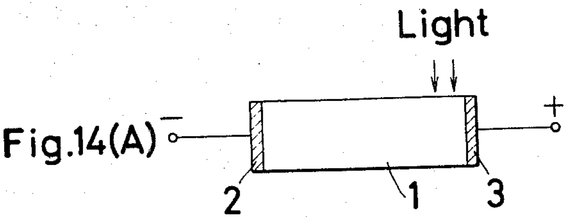
Figure 14B:
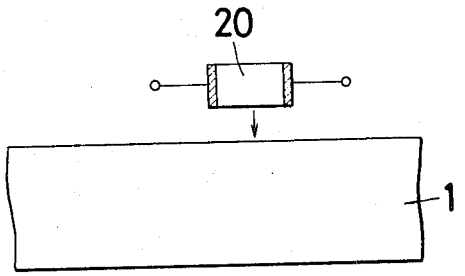
Figure 15A:
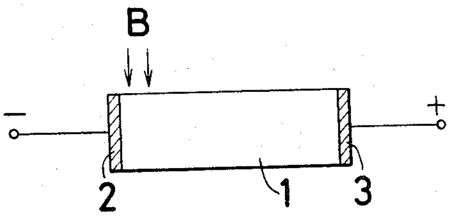
Figure 15B:
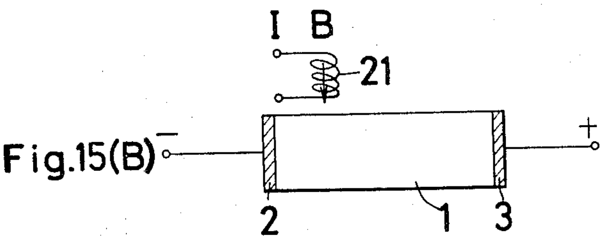
Figure 15C:
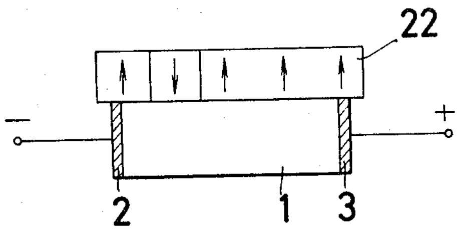
Figure 21:
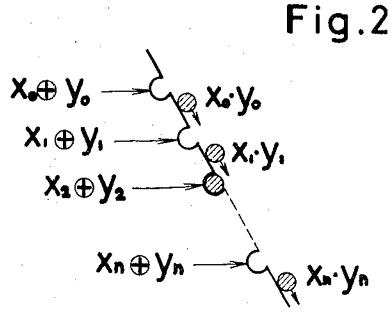
Figure 22A:
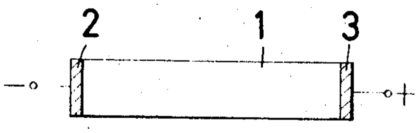
Figure 23A:
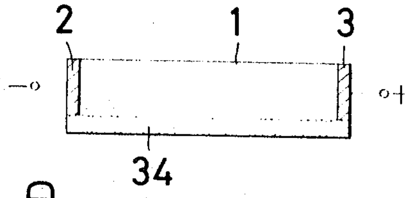
Figure 22B:
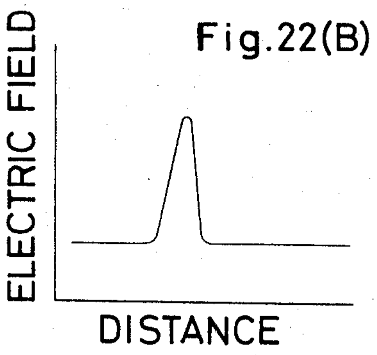
Figure 23B:
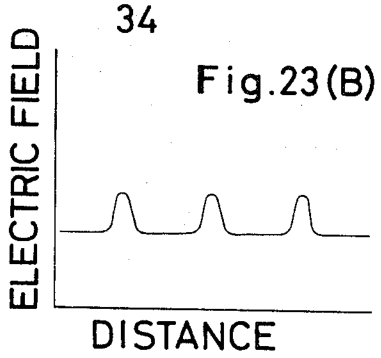
Figure 25:
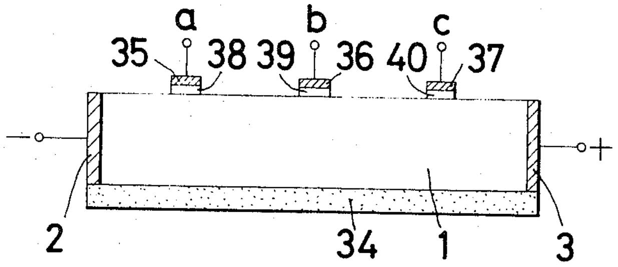
Figure 24:
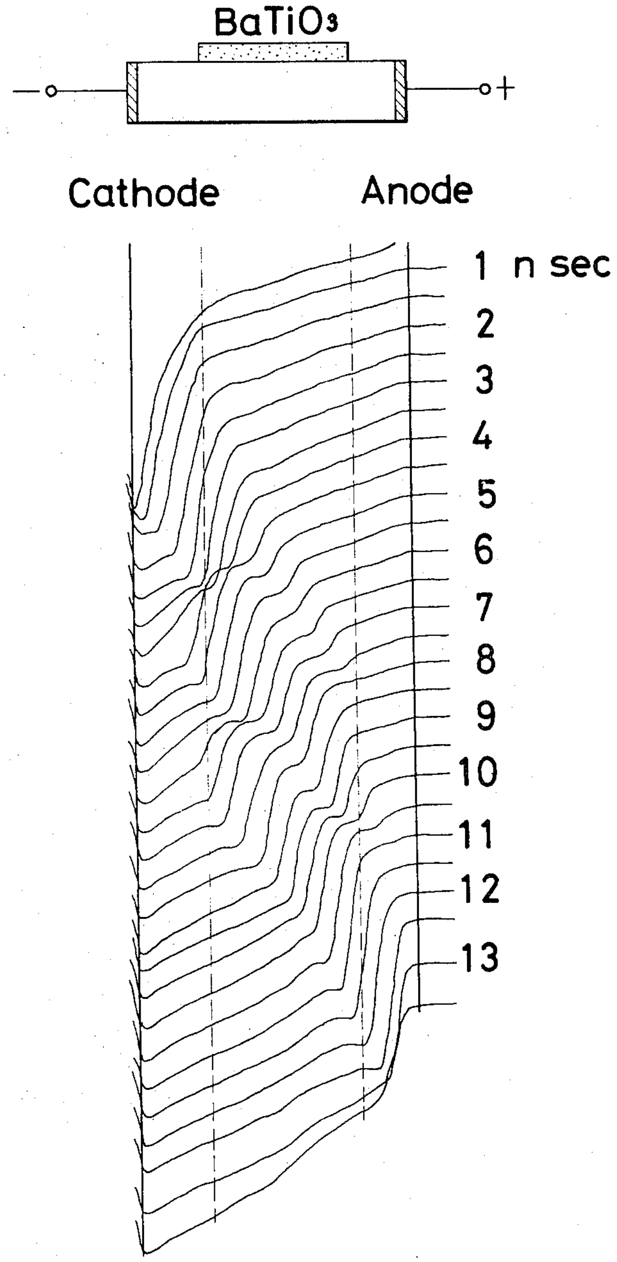
Figure 26B:
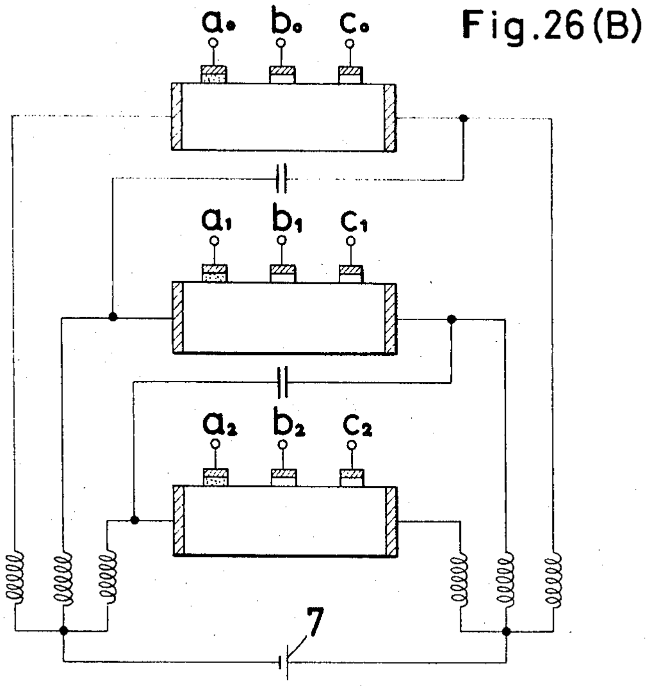
Figure 26C:
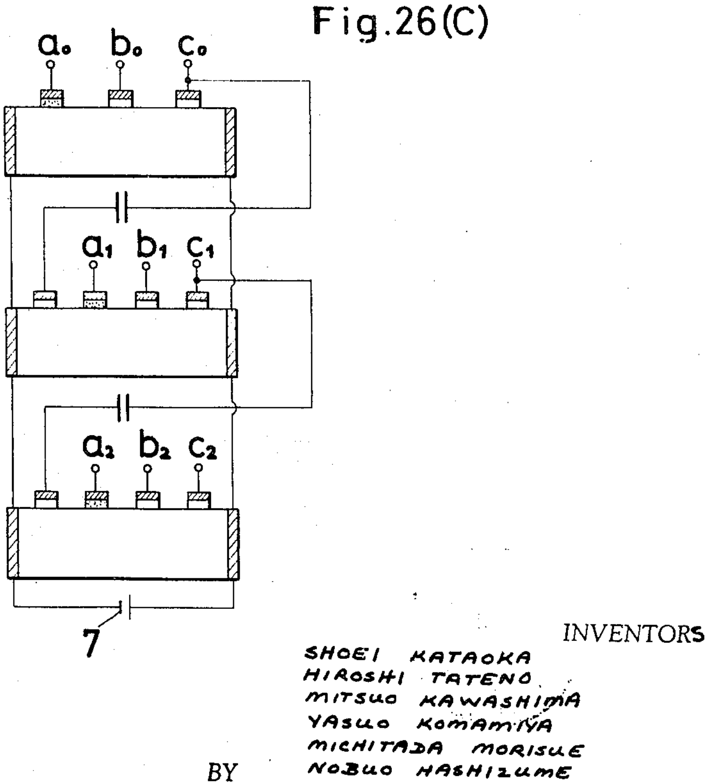
Figure 28A:
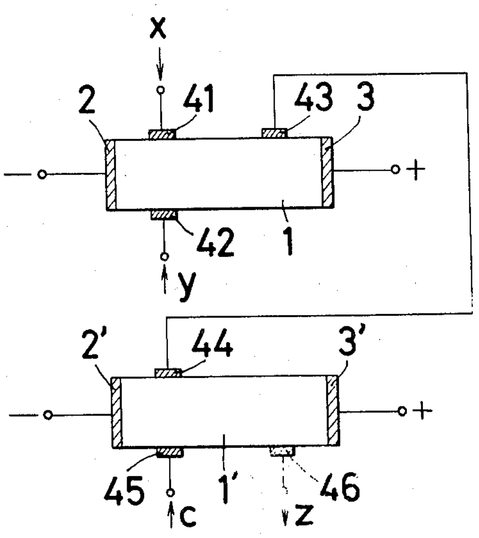
Figure 28B:
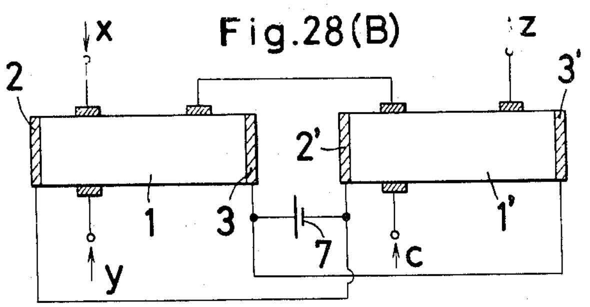
Figure 28C:
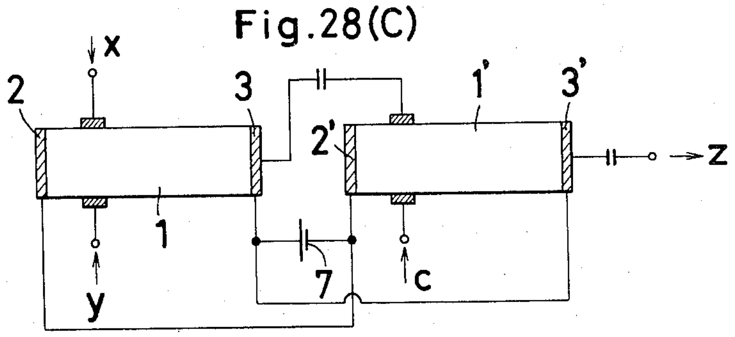
Figure 31:
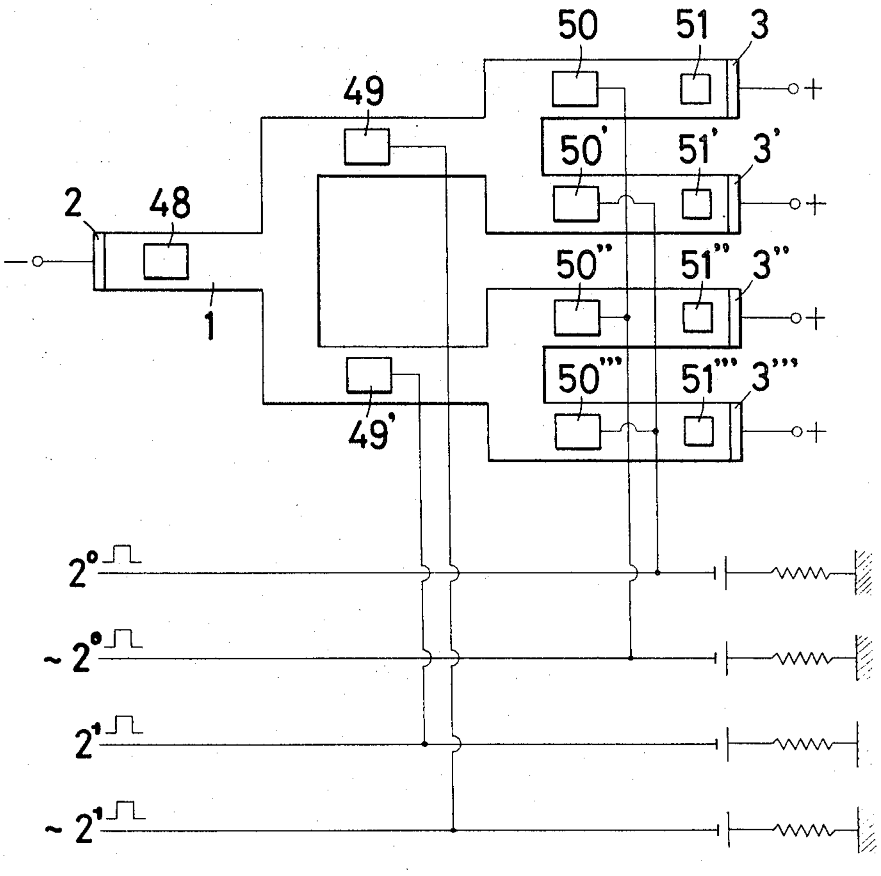
Figure 26A:
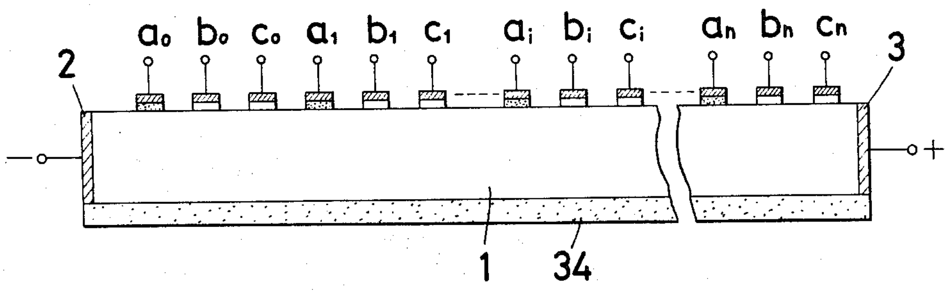
Figure 29A:
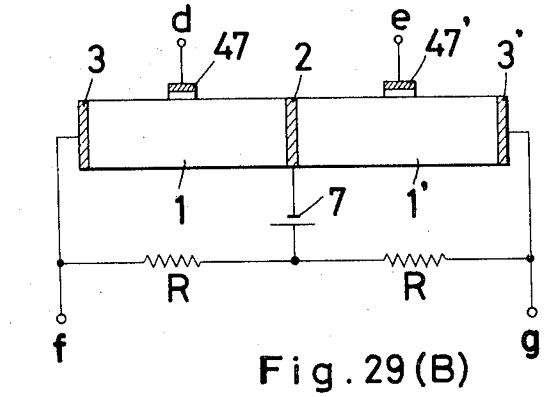
Figure 30:
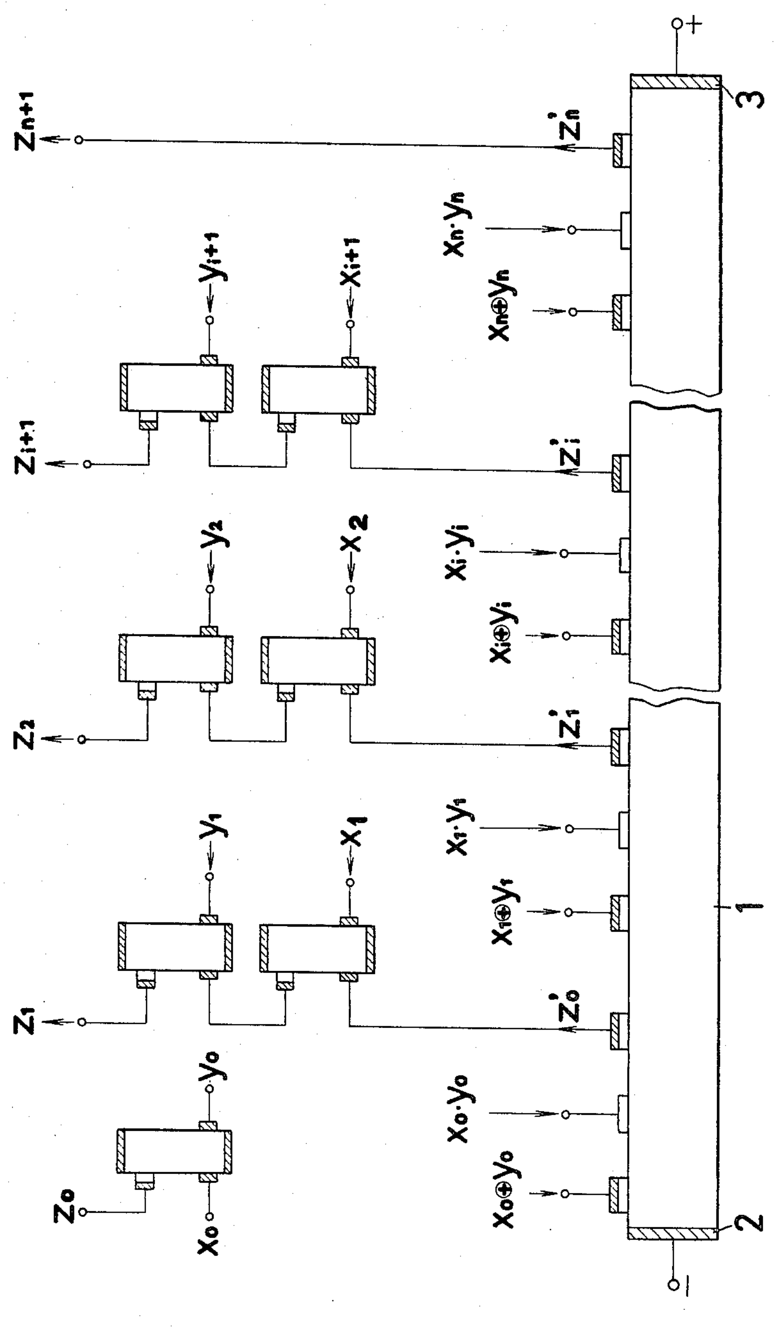

FIGS. 5(A)–5(D) are explanatory views showing a process of the extinction of the high electric field domain in the bulk semiconductor according to the present invention;

FIGS. 6 and 7 show other embodiments for extinguishing a high electric field domain in a bulk semiconductor;

FIG. 8 shows the principle of the extinction of the high electric field domain in a bulk semiconductor;

FIGS. 9(A)–9(C) show experimental data pertinent to the extinguishing of a high electric field domain in a bulk semiconductor;

FIGS. 10(A) and 10(B), FIGS. 11(A) and 11(B), FIGS. 12(A) and 12(B), and FIGS. 13(A) and 13(B) are other embodiments of the present method of controlling a high electric field domain in a bulk semiconductor;

FIGS. 14(A) and 14(B) show another embodiment using light beams for extinguishing a high electric field domain in a bulk semiconductor in accordance with the present invention;

FIGS. 15(A)–15(C) show another embodiment using a magnetic field for extinguishing a high electric field domain in a bulk semiconductor in accordance with the present invention;

FIGS. 16(A)–16(C) show an example of a variable frequency generator using the present method of extinguishing a high electric field domain;

FIGS. 17(A) and 17(B), FIGS. 18(A)–18(D), and FIGS. 19(A)–19(C) show embodiments of high speed digital operation devices using the present method of controlling a high electric field domain;

FIGS. 20(A) and 20(B) show an embodiment of the AND operation using the present method of controlling a high electric field domain;

FIG. 21 is a explanatory view illustrating the operating principle of the method of high-speed carry operation according to the present invention;

FIGS. 22(A) and 22(B) are explanatory views of a semiconductor element exhibiting a negative differential conductivity;

FIGS. 23(A) and 23(B) are explanatory views of an element having a dielectric layer attached to the semiconductor of FIG. 22;

FIG. 24 is a diagram showing a plurality of high electric field domains being generated in the semiconductor element according to the present invention;

FIG. 25 shows an embodiment of the unit operating element having a set of electrodes comprising an extinguishing electrode, a generating electrode and a detecting electrode according to the present invention;

FIGS. 26(A)–26(C) show another embodiment of the unit element having a plurality of sets of electrodes of the type shown in FIG. 25, according to the present invention;

FIGS. 27(A)–27(C), FIGS. 28(A)–28(C), and FIGS. 29(A) and 29(B) show other embodiments of the element using the present method;

FIG. 30 is an explanatory view showing an embodiment of the binary parallel addition system composed solely of bulk semiconductors; and FIG. 31 shows an embodiment of performing decoder operation using the present method.

Figure 1:
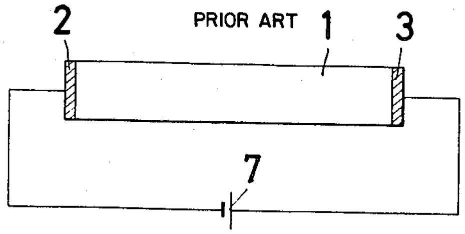
FIG. 1 through 3 show the conventional methods of generating a high electric field domain in a bulk semiconductor element.
Figure 2:
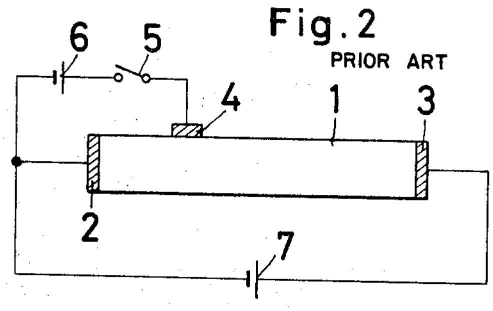
Figure 3:
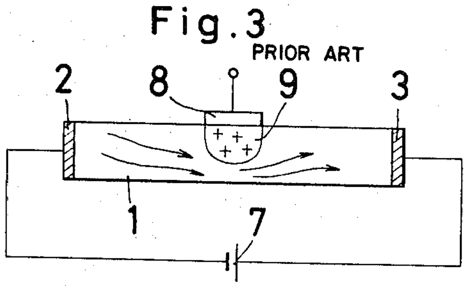

The three above-described conventional methods are illustrated, respectively, in FIGS. 1 to 3, showing semiconductor element 1 and cathode electrode 2 and anode electrode 3 at opposite ends thereof. A third electrode 4 is shown in FIG. 2 illustrating the second method described hereinabove, the second positive voltage being applied therein from source 6 by closing switch 5. In FIG. 3 describing the third conventional method, when a negative voltage is applied from a source 7 to third electrode 8, an electron depletion layer 9 is generated in element 1.

The principle of the present method of extinguishing an existing high electric field domain will be explained with reference to FIGS. 4 and 5.

Figure 4:
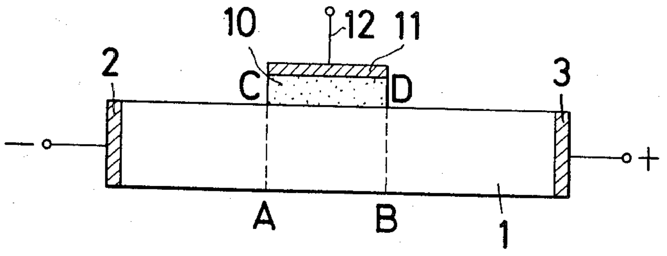
FIG. 4 is an explanatory view showing a method of extinguishing a high electric field domain in a bulk semiconductor.
Figure 5A:
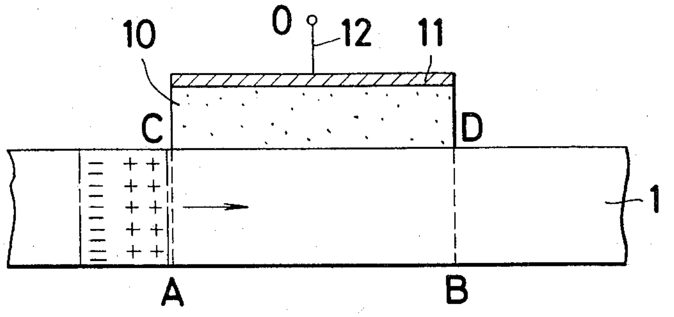
Figure 5B:
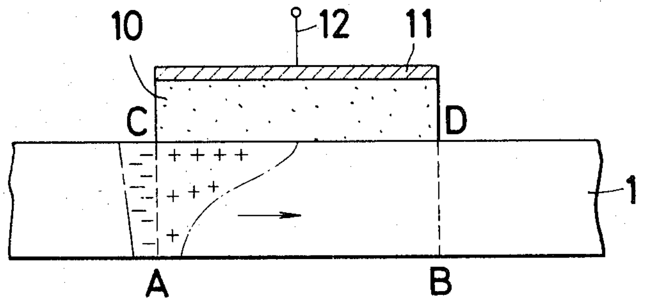
Figure 5C:
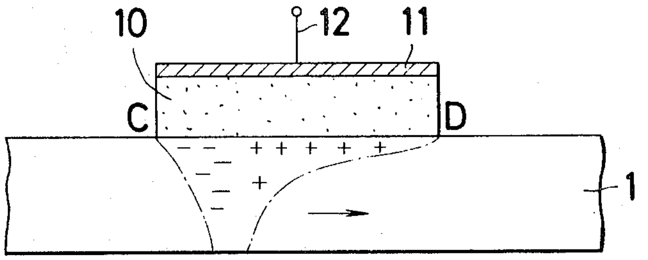
Figure 5D:
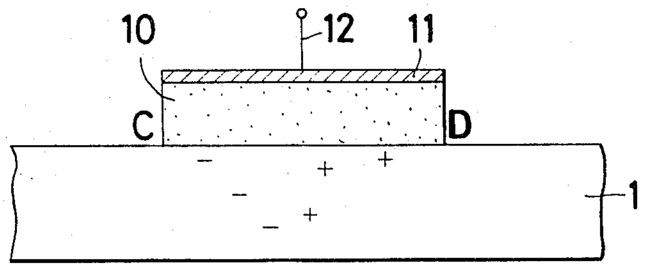

In FIG. 4, there is provided a control electrode 11 through a dielectric layer 10 on a surface of a semiconductor element 1 which has a negative differential conductivity at a high electric field and is provided with cathode electrode 2 and anode electrode 3 on the opposing ends thereof.

Firstly, when no (zero) voltage signal is applied to the control electrode 11 when the permittivity of the dielectric layer 10 is sufficiently larger than that of the semiconductor element 1 or the thickness of the layer 10 is very thin, in other words, when the static capacity of the capacitive electrode is sufficiently large, the electric field extending within the semiconductor along the interface C–D between the dielectric layer and the semiconductor in FIG. 5 is substantially zero and the equipotential planes are in parallel to the interface C–D. Accordingly, a high electric field domain generated in the vicinity of the cathode 2 by a high D.C. voltage across the electrodes 2 and 3 is not affected by the dielectric electrode and is sustained as an electric dipole structure, until it reaches the front end face C–A of the dielectric electrode 10, as shown in FIG. 5(A). When the high electric field domain travels further and a part of the domain enters the portion just below the dielectic electrode as shown in FIG. 5(B), the space charges constituting the high electric field domain (in FIG. 5(B) they are shown as an electron depletion layer) tilt toward the interface C–D due to the field collecting effect of the dielectric layer 10 and the width of the high electric field domain in the travelling direction is increased. This tendency is enhanced as the domain travels under the control electrode 11, and therefore, the number of the electric lines of force is gradually decreased as shown in FIG. 5(C) and the space charges in the semiconductor at a distance from the interface C–D will be substantially extinguished as shown in FIG. 5(D). In this manner the high electric field domain is completely extinguished in the course of its travel.

When a negative voltage is applied to terminal 12, the effect of the high electric field domain extinction due to the presence of the dielectric layer is decreased and the high electric field domain cannot be extinguished below the control electrode 11 and reaches the anode electrode 3 because an electron depletion layer is generated in the semiconductor portion below the dielectric layer so that the portion is isolated from the dielectric layer as shown in FIG. 6. Accordingly, with this construction, the high electric field domain is extinguished when no voltage signal is applied to the control electrode 11 and the domain can be sustained by applying a negative voltage signal to the electrode 11.

In this connection, the above mentioned effect of the high electric field domain using the control electrode is affected by the thickness of the semiconductor body, the permittivity of the electrode and the size of the dielectric layer. For example, where the thickness of the semiconductor is large, the permittivity of the dielectric layer is relatively small, and the size of the electrode is small, the influence of the electrode on the high electric field domain is weak, so that the domain cannot be extinguished in the absence of a voltage applied to the control electrode. In this case however, if a positive voltage is applied to the control electrode 11 to generate an electron accumulation layer in the portion below the interface C–D in the semiconductor, the electron depletion layer of the travelling high electric field domain is neutralized by the electron accumulation layer below the interface C–D and the domain can be extinguished as shown in FIG. 7.

The effects as mentioned above can be obtained even when the capacitive electrode of an ordinary insulating layer is replaced by such electrode of specially high dielectric material. In this case, however, the permittivity of the electrode material determines which of the above two processes is employed. That is, where the thickness of the dielectric layer is small and the metal plate located on the dielectric layer has large area so that the static capacity of the electrode is large, the high electric field domain tends to be extinguished and the domain will be extinguished even when no voltage is applied to the electrode 11 and it can be sustained only by applying a negative voltage to the electrode. However, when the static capacity is small, the domain will not be extinguished when no voltage is applied to the electrode but will be extinguished when a positive voltage is applied so that an electron accumulation layer is generated in the semiconductor body.

There are two processes other than the above mentioned mechanisms in which the high electric field domain can be extinguished by applying a negative voltage to the control electrode 11.

In one method an electron depletion layer is generated in the portion below the dielectric layer to produce the equivalent of a decrease in the cross sectional area of the portion as shown in FIG. 8 and to thereby raise the electric field strength in the portion, so that the potential drop in that portion becomes large and the electric field strength in portions other than the portion below the control electrode 11 is lowered and the high electric field domain is extinguished. In the other means, the electron depletion layer is generated in the vicinity of the control electrode 11, so that the effective thickness "d" of the semiconductor is decreased and the electric field strength of the portion becomes less than the threshold value ($n_o d = 10^{-11}/cm^2$ where $n_o$ is donor density and $d$ is thickness) above which the high electric field domain can exist whereon the high electric field domain decays and is extinguished in the portion. Which of the above mentioned two mechanisms dominates depends upon the donor density in the semiconductor, the configuration thereof, structure of the control electrode, and the magnitude of the bias voltage applied across the cathode and the anode thereof, etc. Since there is a tendency for these mechanisms to cooperate, a combination of those two mechanisms may appear in certain cases.

As above explained, the extinction of the high electric field domain can be considered as depending upon the permittivity of the dielectric layer to be attached on the semiconductor element, the thickness and the length of the layer and the potential applied to the terminal. The higher the permittivity and the thinner the thickness of the dielectric layer, the better the effect.

FIG. 9 shows experimental data obtained when a high electric field domain generated in a GaAs semiconductor was extinguished in accordance with the present invention. In this experiment, ohmic electrodes 2 and 3 were provided at the oppositing ends of the semiconductor 1 having a length of 1.2mm as shown in FIG. 9(A) and a voltage of 348 volts was applied thereacross as a D.C. bias voltage. At this bias voltage no high electric field domain was generated in the semiconductor. By providing a capacitive trigger electrode 14, which was deposited on an insulating layer 13 adapted to be attached directly to the semiconductor 1 at a position removed from the cathode electrode 2 by 100 microns and applying a voltage of 50 volts to the trigger electrode 14, a high electric field domain was generated as shown in FIG. 9(B), wherein the potential distribution along the element is plotted with time as the parameter and the step represents a high electric field domain. When no voltage is applied to a capacitive control electrode 11 which, having a dielectric layer 10 attached directly to the semiconductor 1, is provided at a position removed from the anode 3 by 300 microns, the high electric field domain is generated in the vicinity of the trigger electrode 14 and reaches the anode 3 without any interference as shown in FIG. 9(B). As shown in FIG. 9(B) at time 0, where no high electric field domain is generated, the voltage distribution is substantially a straight line. When a high electric field domain is generated, a step appears in the voltage distribution and the step shifts toward the anode with passage of time as seen for times later than 2 nano seconds.

When a negative voltage of 155 volts is applied to the control electrode 11, the high electric field domain is extinguished at about the control electrode 11 as shown beyond 8 nano seconds in FIG. 9(C).

While in the method of controlling a high electric field domain described the control electrode is attached through a dielectric layer or insulating layer on the semiconductor, the same effect can be obtained by using a resistive layer instead of the dielectric layer or insulating layer.

Figure 10A:
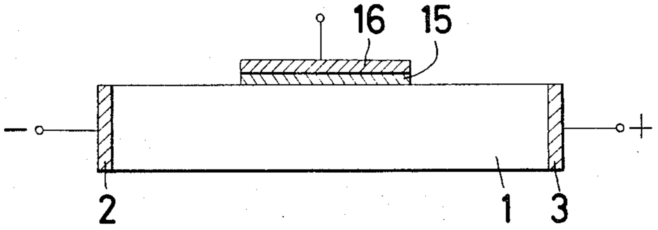
Figure 10B:
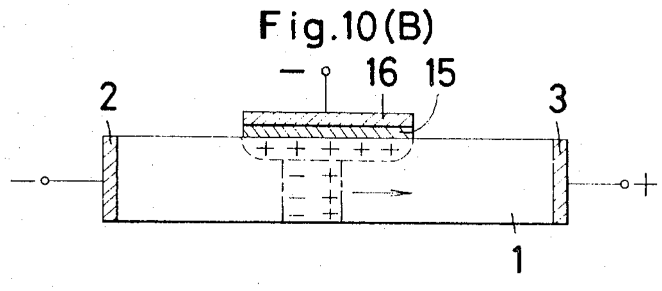

That is, as shown in FIG. 10(A), when a control electrode 16 attached through a resistive layer 15 on a semiconductor 1 is supplied with a positive voltage or no voltage, the electric field in a portion below the control electrode 16 is weakened and the space charges sustaining the high electric field domain is discharged through the resistive layer, thereby causing the domain to be extinguished. On the other hand, when a negative voltage is applied to the electrode 16, a depletion layer is formed in the border portion between the semiconductor and the resistive layer as shown in FIG. 10(B) preventing the resistive layer from affecting the high electric field domain and thus the high electric field domain is not extinguished but travels toward the anode 3. The resistive layer 15 disposed between the semiconductor and the metal electrode may be of ordinary resistor material or of P-type semiconductor. An embodiment using P-type semiconductor will be described later in detail.

Now, an embodiment using a metal directly attached to a semiconductor as the control electrode, i.e., an embodiment having a Schottky type electrode will be described in reference to FIG. 11.

As shown in FIG. 11, a Schottky electrode 17 formed of a metal is provided on a portion of one surface of a semiconductor 1.

Figure 11A:
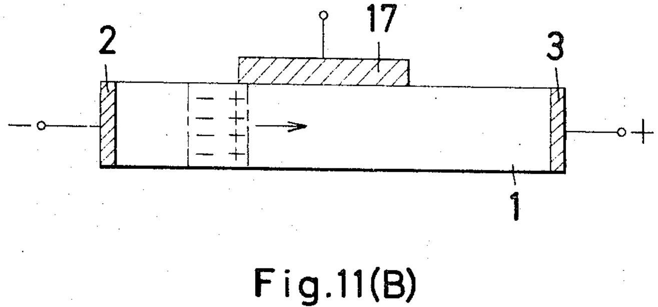
Figure 11B:
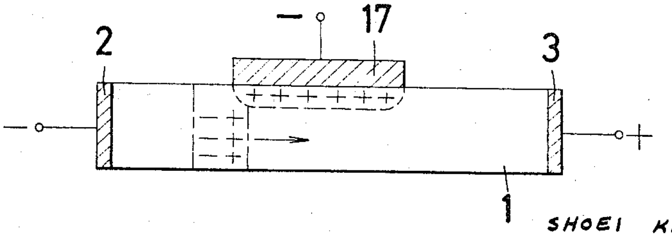

Since this Schottky electrode 17 acts as a mere metal electrode to a high electric field domain travelling toward an anode 3 as shown in FIG. 11(A) when no voltage is applied to the electrode and the electric field in the semiconductor portion just below the electrode 17 is very weak, the space charges contained in the high electric field domain entering that portion is shortcircuited by the electrode 17 with the result that there is a simultaneous decrease of the electric field strength within the domain which causes it to be extinguished. On the contrary, when a negative voltage is applied to the electrode 17 as shown in FIG. 11(B), the short-circuit effect due to the metal is eliminated and there exists an electric field in the semiconductor since an electron depletion layer is produced in the semiconductor portion just below the metal electrode 17, in accordance with the Schottky effect so that the travelling high electric field domain not extinguished but continues to move toward the anode. That is, when no voltage is applied to the Schottky electrode the high electric field domain is extinguished but when a negative voltage signal is applied the domain is not extinguished.

An embodiment using a P-N junction as the control electrode will be explained with reference to FIGS. 12 and 13.

Figure 12A:
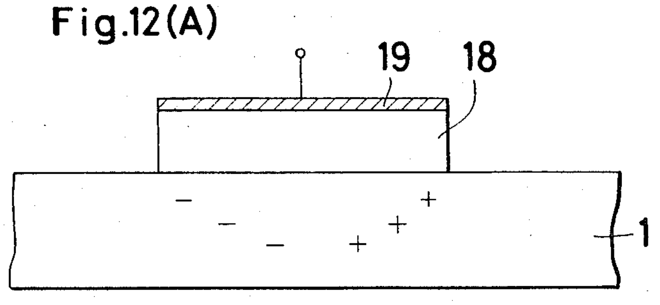
Figure 12B:
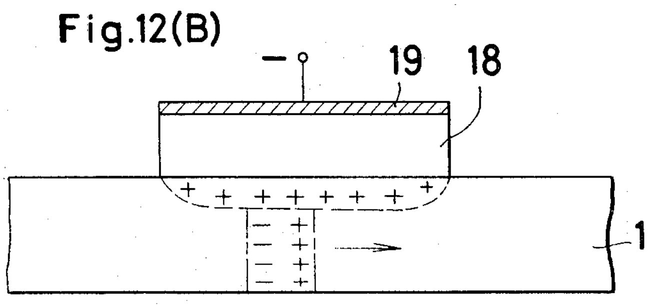
Figure 13A:
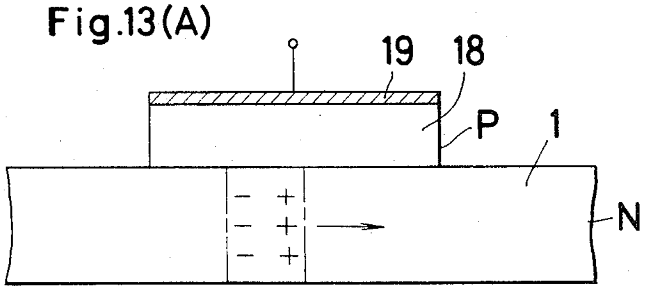
Figure 13B:
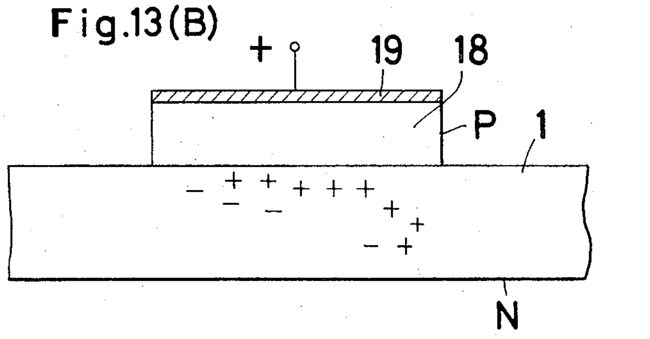

In FIG. 12(A), when the conductivity of the P-type semiconductor 18 used as the electrode 19 is large in comparison with that of the N-type semiconductor 1, the electric field strength in the semiconductor portion just below the electrode 19 is very weak and thus the high electric field domain is extinguished. In this case, however, since if a negative voltage is applied to the electrode 19 as shown in FIG. 12(B) the P-N junction is reverse-biased so that the short-circuit effect is not had and therefore the high electric field domain can continue to travel without extinction. On the other hand, as shown in FIG. 13(A), where the conductivity of the P-type semiconductor 18 used as the electrode 19 is smaller than that of the N-type semiconductor, the electric field strength in the N-type semiconductor portion below the electrode is maintained higher than the threshold value sufficient to sustain the high electric field domain even when no voltage is applied to the electrode and thus the domain is not extinguished. In this case, however, if a positive voltage is applied to the electrode 19, the P-N junction is forward-biased and a large number of holes are injected, so that the resistance of the P-N junction is lowered and the high electric field domain is extinguished.

Now embodiments using light beams to extinguish a high electric field domain will be described.

As shown in FIG. 14(A), when a local portion of a bulk semiconductor 1 is irradiated by light, a large number of electron and hole pairs are produced at such local portion, so that the conductivity of that portion is increased and the electric field strength in that portion is lowered to a level less than that required to sustain the high electric field domain to thereby cause the domain to be extinguished. FIG. 14(B) illustrates a method of extinguishing 9 high electric field domain in a semiconductor 1 by using a light-emitting diode 20 to irradiate the semiconductor 1.

FIG. 15 illustrates a method of extinguishing a high electric field domain by applying a magnetic field to a local portion of a semiconductor. As shown in FIG. 15(A), when a magnetic field "B" is applied locally, the resistance of such local portion is increased in accordance with the magneto-resistive effect and the electric field strength in that portion is increase, so that the electric field strength in the other portion is lowered to a level less than that required to sustain the high electric field domain to thereby cause the domain to be extinguished.

FIG. 15(B) illustrates a method of applying a magnetic field "B" to a local portion of a semiconductor 1. The same effect may be obtain by supplying an electric current through a coil 21 or by using a magnetic domain in an ortho-ferrite 22 as shown in FIG. 15(C).

Since in this manner a high electric field domain can be extinguished at any desired position in the bulk semiconductor element by using the various external signals, the element may be employed in various devices.

Figure 16:
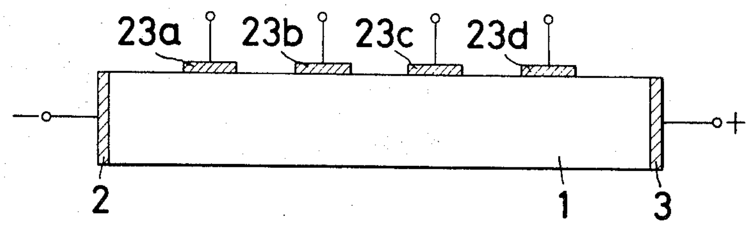
Figure 16:
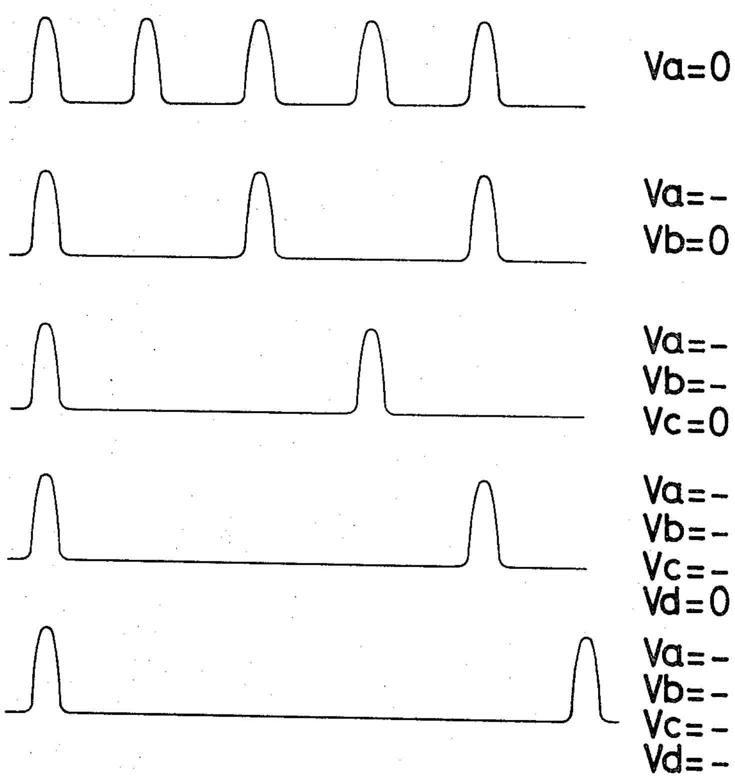

FIG. 16 shows, as an example of a device employing this invention, a variable frequency generator whose output frequency is controlled by an external signal. In the device a plurality of electrodes 23 are provided on one side of a semiconductor 1 and the output frequency is varied in accordance with the change in travelling distance of the high electric field domain generated at the cathode 2. Changes in travelling distance are caused by supplying the electrodes 23 with a negative or zero voltage as shown in FIG. 16(B).

In this embodiment, since the electrodes 23 are Schottky electrodes, the high electric field domain generated at the cathode 2 is extinguished at the electrode 23*a* when voltage V*a* is zero so that a pulse whose duration corresponds to the distance between the cathode 2 and the electrode having the voltage V*a* is generated. On the contrary, when the voltage V*a* is negative an electron depletion layer is generated below the electrode 23*a* and the metal no longer serves as a short-circuit. The high electric field domain thus continues to exist and travels to the electrode 23*b* to which no voltage or even positive voltage has been supplied. The pulse interval is thus elongated to a value corresponding to the distance between the cathode 2 and the electrode 23*b*. In this manner, the pulse interval can be varied.

Now, an embodiment will be described, in which the method of generating and/or extinguishing the high electric field domain in accordance with the present invention are applied to an ultra high speed digital operation device. Firstly the application of the present invention to an ultra high speed logical AND operation will be described.

As shown in FIG. 17(A), two Schottky gate electrodes 24 and 25 are provided on and along one side of a semiconductor 1 and a D.C. bias voltage of suitable value is applied across the ohmic electrodes 2 and 3. The structure of the electrode 23 and the structure of the semiconductor per se is suitably selected, so that when a negative signal voltage is applied to the trigger electrode 25 a local electron depletion layer 26 is generated causing a high electric field domain 28 to be generated. If a Schottky gate electrode 24 having the function described is provided on the anode side of the semiconductor 1 so constructed, the domain 28 can travel toward the anode only when the electron depletion layer 27 is generated by a negative signal voltage applied to the gate electrode 24 and can be detected by the detection electrode 29 connected through, for example, an insulater 30 to the semiconductor 1. Now assume the input signals applied to the respective electrodes 25 and 24 to be represented by "x" and "y", zero voltage by "0", negative voltage by "1", the output voltage of the detection electrode 29 by "z", and the presence and the absence of the high electric field domain, i.e. the presence and the absence of the output by "1" and "0" respectively. The truth table in this case can be represented as in FIG. 17(B) and the logical AND operation can be performed. In the above described application the same effect can be obtained by using a capacitive structure, a structure having a metal electrode positioned on a resistive layer attached directly to the semiconductor or a P-N junction structure, as the control electrode.

It should be understood that the method of generating a high electric field domain may be any of the conventional methods, and the method of extinguishing the domain may be any of the previously described methods.

FIG. 18(A) is an embodiment of performing a more complex operation. In this device, a capacitive electrode 31, another capacitive electrode 32 and a capacitive electrode 33 are provided on a surface of a bulk semiconductor 1 of GaAs as high electric field domain generating electrode, the extinguishing electrode and detecting electrode, respectively. A bias voltage which is lower than the high electric field domain generating threshold voltage $V_{th}$ but higher than the sustaining voltage $V_s$ is applied across ohmic electrodes 2 and 3 provided on the oppositing ends of the semiconductor element 1.

In this arrangement, when a negative voltage signal is applied to the electrode 31 a high electric field domain is generated. At the same time, if a negative voltage signal is applied to the electrode 32, the domain generated by the signal fed to electrode 31 will be extinguished in the vicinity of the electrode 32 and therefore the detecting electrode 33 will detect no domain. When it is assumed that the present and absence of the signals correspond to the binary "1" and "0" respectively, that the voltage inputs to the electrodes 31 and 32 are represented as "x" and "y", and that the output voltage is represented by "z", the truth table is as in FIG. 18(D) and the logical operation of $z = x{\cdot}{\sim}y$, i.e., $X{\cdot}y$, can be performed. This may be considered a modification of Sheffer's stroke and with combinations of the operation all of the logical operation can be performed.

For example, FIG. 19 illustrates an embodiment in which an electric signal is applied directly to the cathode to generate a high electric field domain. As shown in FIGS. 19(A) and 19(B), when a signal $x$ and a signal $y$ respectively are used to generate and to extinguish a high electric field domain and the presence of such high electric field domain is detected by an output signal $z$, the output signal provides the result of the logical operation $z = x{\cdot}{\sim}y$. In this case, any of the above described methods can be utilized as the method of extinguishing the high electric field domain. That is, the high electric field domain can be extinguished by either positive or negative voltage pulse.

Further, using any combination of these constructions, if one of the inputs is made constant the negative of the other input is performed as shown in FIG. 20(A) and if two elements are combined as shown in FIG. 20(B), AND operation of $z = x{\cdot}y$ can be obtained.

Further, an example of performing adder operation at an extremely high speed utilizing high electric field domains in the bulk semiconductor is explained.

The recent increase in the volume of information has inevitably necessitated a radical reduction in the operating time of the electronic data processing system. Heretofore, the operation of addition has been performed by a method whereby the addition of numbers is effected sequentially from the least significant digit onwardly by means of switching elements such as transistors. In such operation, the highest switching time achievable per switching element has been only on the order of several nano seconds. Consequently, this conventional method proves disadvantageous in that it requires the use of a highly complicated circuitry and consumes very much time in the processing of data.

This invention enables parallel addition and other logical operations to be performed at an extremely high speed by utilizing high electric field domains in bulk semiconductors. It overcomes the aforementioned drawbacks and succeeds in reducing the size of the data processing system and increases the speed of data processing.

The present invention is now described in further detail with reference to FIGS. 21 to 29.

FIG. 21 is a diagram illustrating the operating principle of the high-speed carry underlying the present invention. By way of explanation, addition in the binary system is compared to a ball-rolling game. When a ball is caused to roll down the surface of a tilted board as illustrated, it will keep rolling over other balls already held fast in holes until it drops into the first unoccupied hole. In this case, the ball corresponds to the action of a "carry" in binary addition. The case, in binary addition, where the bits ($x_1$ and $y_1$, for example) at a given binary place of the two numbers X and Y are both 1's or 0's is represented by the corresponding hole being empty of a ball. In other words, the case where the logical sum of $x_1$ and $y_1$ is 0 or $x_1 \oplus y_1 = 0$, is represented by the hole being empty of a ball. The hole is no longer empty of a ball where one of the two bits is 1 and the other is 0. To be more specific, when $x_1 = 1$ and $y_1 = 0$ or when $x_1 = 0$ and $y_1 = 1$, the equation becomes $x_1 \oplus y_1 = 1$ and this is represented by the hole in question being filled by a ball. In this analogy, the existence of a ball to roll down the board corresponds to the bits falling at a given binary place both being 1 so as to satisfy the equation of $x_1 y_1 = 1$. The "carry" signals are expressed as $x_o y_o, x_1 y_1, \ldots, x_n y_n$ and a ball which has been caused to roll down by the corresponding "carry" signal falls into the first unoccupied hole. The ball generated from a given binary place never collides with the ball generated from any of the subsequent binary places.

In place of the ball mentioned in the preceding description of the working principle, the present invention utilizes the high electric field domain generated in the semiconductor of such substance as GaAs which exhibits a negative differential conductivity at high electric field. By the use of the high electric field domain, this invention enables the "carry" operation to be performed parallelly in all the pertinent binary places.

Heretofore, there could be generated only one high electric field domain in a conventional semiconductor element as shown in FIG. 22. This element never permits a plurality of such high electric domains to be generated at the same time.

However, in the case of a semiconductor such as GaAs having a dielectric material of higher permittivity than that of the semiconductor attached to the surface thereof, the dielectric absorbs the space charges within the semiconductor and the high electric field domain inside the semiconductor is small in magnitude. Consequently, this element permits a plurality of the high electric field domains to co-exist at the same time as illustrated in FIG. 23.

Although the above description refers to a method of causing a plurality of high electric field domains to coexist by the attachment of a dielectric material to the semiconductor, it is also possible to make a plurality of such domains exist by replacing the dielectric material with an insulating material to which a metal has been attached on the face of the insulating material not in contact with the semiconductor.

FIG. 24 shows by the results of an actual experiment that a plurality of the high electric field domains can be produced in succession by attaching $BaTiO_3$ as a dielectric material upon GaAs semiconductor element. The voltage distribution in the element was measured with time as a parameter and the step showing the high electric field domains.

The present invention, therefore, causes a plurality of high electric field domains to co-exist at desired positions within the semiconductor or causes existing high electric field domains to be extinguished at desired positions by making use of the effect of the dielectric or the effect of the distribution of the capacitance upon the high electric field domain. This fact makes it possible to perform a carry in the binary operation at an extremely high speed by use of the high electric field domains, in much the same way as in the ball-rolling game shown in FIG. 21.

For the purpose of generating a high electric field domain at a required position, any of the conventional methods as shown in FIGS. 1 to 3 can be utilized. The method of extinguishing the domain can be any of the previously described methods. For example, in FIG. 6 a control electrode 11 is provided through a dielectric layer 10 on a bulk semiconductor 1 and the domain is extinguished by applying a positive voltage to the electrode 11.

FIG. 25 represents an example of a unit operating element which is formed by attaching a high electric field domain extinguishing electrode "a" fitted with a metal 35, a high electric field domain generating electrode "b" fitted with a metal 36 and a high electric field domain detecting electrode "c" fitted with a metal 37, through insulative layers 39, 38 and 40 respectively, to the semiconductor 1 in the manner mentioned previously.

FIG. 26(A) is an example of a unit element having a plurality of such sets of electrodes arranged on the semiconductor 1 incorporating a dielectric material 34. In the case where the length of the semiconductor is long and the value of required D.C. bias voltage is too high because of such combination of many sets of electrodes, an alternative configuration can be used in which several component elements, each short from the standpoint of D.C. voltage, are interconnected in parallel as illustrated in FIG. 26(B) and the cathodes 2 and the anodes 3 thereof connected by means of capacitive coupling, for example, to permit high electric field domains to travel through the component elements in series. FIG. 26(C) shows another example of a unit which is slightly modified from the unit shown in FIG. 26(B).

In order to operate high speed carry in accordance with the principle shown in FIG. 21, it is only necessary to feed an electric signal $x_o \oplus y_o$ to the first high electric field domain extinguishing electrode $b_o$ and an electric signal $x_o \cdot y_o$ to the first domain generating electrode $a_o$, and to detect the presence or absence of high electric field domain by means of the first domain detecting electrode $c_o$ and, thereafter, to carry out the same procedure on the other sets of electrodes parallelly. When this operation is effected, the electric outputs from the individual high electric field domain detecting electrodes $c_o, c_1, \ldots, c_n$ directly cause a "carry" in each corresponding binary place in the binary addition.

Figure 27A:
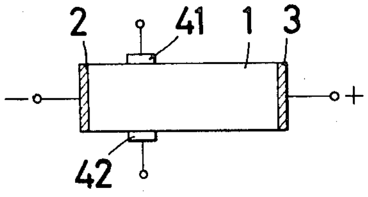
Figure 27B:
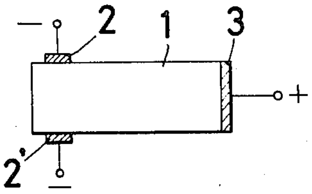
Figure 29B:
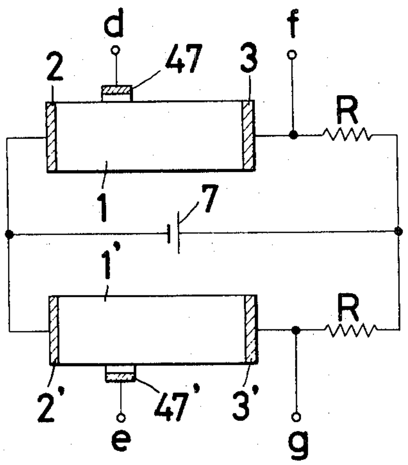
Figure 27C:
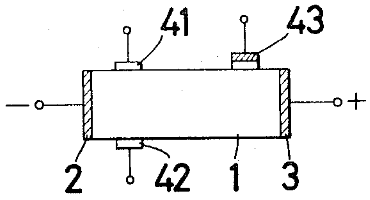

In finding an answer to the addition in the binary operation, it is only necessary to determine whether the sum $z$ of $x$, $y$ and $c$ is an odd or even number. Also for this purpose, the high electric field domain can be used. To be specific, the generation of high electric field domain can be accomplished by symmetricaly disposing two electrodes 41 and 42, which may be ohmic, non-ohmic, capacitive or otherwise, on the surface of an element having ohmic electrodes 2 and 3 attached to the semiconductor 1 exhibiting negative differential conductivity as illustrated in FIG. 27(A), keeping D.C. electric field within the semiconductor at a magnitude smaller than the domain generating critical field $E_{th}$ but larger than the domain sustaining field $E_s$ and applying a pulse voltage upon either of the electrodes 41 and 42. In this case, a high electric field is produced locally and develops into a high electric field domain only when the signal voltage is applied only to either of the two electrodes 41 and 42. However, when the signal voltage is applied to both of the two electrodes, the local electric field generated within the semiconductor is too small in magnitude to develop into a high electric field domain. Such semiconductor element, therefore, has the function of an EXCLUSIVE OR. A similar function can be achieved by impressing a D.C. voltage directly on the ohmic electrodes 2 and 2′ as illustrated in FIG. 27(B). For the purpose of detecting the high electric field domain generated as a consequence, it is sufficient to attach a capacitive electrode 43 to the surface of the semiconductor 1 as illustrated in FIG. 27(C). Alternatively, the detection may be accomplished on the basis of the change in magnitude of the electric current flowing between the electrodes 2 and 3 of the element 1.

Where this method is used in two stages, the question as to whether the sum z of the three numbers $x$, $y$ and $c$ is an odd or even number can be solved by detecting a final high electric field domain by means of the electrode 46 as shown in FIG. 28. The final high electric field domain does not come into existence where the sum $z$ of $x$, $y$ and $c$ is an even number. The high electric field domain is detected where the sum of them is an odd number. Besides, it is possible to utilize the fact that the magnitude of electric current varies in the presence of high electric field domain. FIG. 29 illustrates examples of the use of this phenomenon; the semiconductors 1 and 1′ each having two regions 2 – 3 and 2 – 3′ (or 2 – 3 and 2′ – 3′ in FIG. 29(B)) have signal electrodes 47 and 47′ attached respectively to the regions, with the signal impressed on the terminals "d" and "e". The semiconductors 1 and 1′ are connected in series each with a resistor "R" to permit application of D.C. voltage thereon. The structure and function of the electrode 47 and 47′ may be those of the high electric field domain generating electrode or those of the high electric field domain extinguishing electrode so long as both the electrodes have the same function. When the signal is applied to both or neither of the terminals "d" and "e" connected to the signal electrodes 47 and 47′, respectively, the high electric field domain exists in both or neither of the two regions. Thus, the electric current flowing through one region has the same magnitude as that through the other region. Accordingly, no electric output is delivered at the output terminals "f" and "g" which extend from the electrodes 3 and 3'. In other words, no output signal is produced where the sum of the input signals is an even number. When the signal is applied upon either of the terminals "d" and "e", a high electric field domain comes into existence in the region on the corresponding side and no domain exists in the other region. Accordingly, a big difference occurs between the electric currents flowing through the two regions, giving rise to an electric output between the output terminals "f" and "g". This means that the output signal is produced where the sum of the input signals is an odd number.

To determine whether the sum of two or more input signals is an even or an odd number, it is only necessary that a required number of such elements may be piled one on top of another so as to perform addition.

On the basis of the principle described above, the binary parallel addition can be accomplished by the sole use of bulk semiconductors. FIG. 30 illustrates one example. When two binary numbers X and Y are added by using this method, the addition is performed parallelly in all the binary places simultaneously with the action of "carry". With extreme rapidity, there is consequently obtained the sum Z which has the numbers $z_o$, $z_1, \ldots, z_n$ in the sequential binary positions. The speed of this addition, even at the slowest, is determined by the time in which the high electric field domain travels from the cathode 2 to the anode 3 within the bulk semiconductor 1. In case of GaAs, the high electric field domain travels at the speed of $10^7$ cm/sec. Assuming an addition involving up to 30 binary places, the overall length of elements required will be about 1 mm assuming the width of electrodes and their intervals to be both 20 microns. The time required for the high electric field domain to travel from one end to the other of the element is 10 nano seconds. The addition is completed within this length of time. This is a conspicuously high speed as compared with that of the addition performed by the conventional electronic computer.

Further, the scope of logical operations achievable can be broadened greatly by using the aforementioned phenomenon wherein the high electric field domain is wiped out of existence by means of a signal.

An example of performing decoder operation at an extremely high speed utilizing the high electric field domain extinguishing effect will be explained with reference to FIG. 31. In FIG. 31 a semiconductor 1 which has a negative differential conductivity at high electric field is patterned in a branch-type configuration and bias voltages are applied between cathode 2 and anodes 3, 3', 3'' and 3''' so that the electric field in the semiconductor 1 is above the high field domain sustaining field $E_s$ but below the high electric field domain generating threshold field $E_{th}$ throughout the semiconductor. Trigger electrode 48 provided in the vicinity of cathode 2 is of any of aforementioned types which causes a high electric field domain to generate in the vicinity of the cathode 2. Subsequent propagation of high field domain generated near the cathode is controlled by the high electric field domain extinguishing electrodes 49, 49', 50, 50', 50'' and 50''' which are fed with positive voltage by input lines $2^o$, $\sim 2^o$, $2^1$, and $\sim 2^1$. The high electric field domain extinguishing electrodes 49, 49', 50, 50', 50'' and 50''' are biased to a negative voltage so that when no positive voltage are coming in from the input lines $2^o$, $\sim 2^o$, $2^1$ and $\sim 2^1$an electron depletion layer is generated in the portion below each domain extinguishing electrode resulting in an equivalent decrease in the crosssectional area of the portion to thereby raise the electric field strength in such portion, so that the potential drop in that portion becomes larger and the electric field strength in portions other than the portion below the domain extinguishing electrode is lowered to a negligible value. When, for example, input lines $2^1$ and $2^o$ are fed positive voltage and the other two lines no positive voltage, the domain extinguishing electrodes 49', 50' and 50''' have their negative bias voltages offset by the incoming positive voltages thereby causing the electron depletion layer in the portion below each domain extinguishing electrode to disappear, so that there is no more decrease in the equivalent crosssectional area of the portion. However, the electric field strength at the portions other than the portion below the domain extinguishing electrodes is almost negligible if there is even one domain extinguishing electrode whose negative bias voltage is not offset by a positive signal voltage, causing the equivalent crosssectional area of the semiconductor 1 to be very small. For example, when negative voltage is applied to the domain extinguishing electrodes in all branches except the electrodes 49' and 50''' to which a positive signal voltage is applied, the electric field only in the branch containing electrodes 49' and 50''' will be sustained above $E_s$ everywhere, thereby enabling a high electric field domain generated near cathode 2 by generating electrode 48 to propagate along that branch only and finally to be detected by domain detecting electrode 51''' placed in the vicinity of anode 3'''.

The example which has been given here is only by way of explanation. It is further possible to combine the method of generating and extinguishing high electric field domains of this invention with branched semiconductor configuration to provide other embodiments such as, for example, an encoder.

The semiconductor of GaAs, for example, only requires metallic electrodes to be attached, either ohmically or capacitively. This circuit arrangement, though complicated in appearance, can be fabricated with extreme ease by adopting the integrated-circuit technology applying the photolithografic method to the epitaxial layer of the semiconductor. This integral functioning elements, despite its minute size of about 1 mm, is efficient enough to permit additions of 9 up to 30 binary places and, therefore, is expected to make a significant contribution to reducing the dimensions of electronic computors.

In summary, the present invention is directed to methods for extinguishing high electric field domains and to methods for utilizing the generation and extinguishment of electric field domains in a bulk semiconductor such as of GaAs having negative differential conductivity, to perform addition and other logical operations in the binary system with an extremely small device at extremely high speed. Thus, it will make a marked contribution to the engineering of information processing.

What is claimed is:

1. A control method of sustaining or extinguishing a high electric field domain in a semiconductor having a negative differential conductivity at high electric field and provided with at least two ohmic bias electrodes, comprising the step of varying locally the internal electric field of said semiconductor by capacitive electrode means to thereby extinguish said high electric field domain or to thereby sustain said domain in its transit to an anode in said semiconductor.

2. A control method of extinguishing a high electric field domain in a semiconductor as set forth in claim 1, wherein at least one capacitive electrode having a static capacity sufficient to extinguish said high electric field domain on said semiconductor is provided on the semiconductor.

3. A control method of sustaining a high electric field domain in a semiconductor as set forth in claim 2, wherein a negative voltage is applied to said capacitive electrode.

4. A control method of extinguishing a high electric field domain in a semiconductor as set forth in claim 1, wherein said semiconductor further comprises at least one additional capacitive electrode thereon and a voltage is applied to said at least one additional capacitive electrode.

5. A control method of extinguishing a high electric field domain in a semiconductor as set forth in claim 4, wherein said voltage to be applied to said capacitive electrode is positive.

6. A control method of extinguishing a high electric field domain in a semiconductor as set forth in claim 4, wherein said voltage to be applied to said capacitive electrode is negative.

7. A control method of extinguishing a high electric field domain in a semiconductor as set forth in claim 1, wherein an electrode having a conductivity sufficient to extinguish said domain is provided on said semiconductor.

8. A control method of sustaining a high electric field domain in a semiconductor as set forth in claim 7, wherein a negative voltage is applied to said electrode.

9. A control method of extinguishing a high electric field domain in a semiconductor as set forth in claim 7, wherein said conductive electrode is of a P-N junction.

10. A control method of extinguishing a high electric field domain in a semiconductor as set forth in claim 7, wherein said conductive electrode is of a resistive material.

11. A control method of extinguishing a high electric field domain in a semiconductor as set forth in claim 7, wherein said conductive electrode is of a metal.

12. A control method of extinguishing a high electric field domain in a semiconductor having a negative differential conductivity at high electric field and provided with at least two ohmic bias electrodes, comprising the step of irradiating said semiconductor with a light.

13. A control method of extinguishing a high electric field domain in a semiconductor having a negative differential conductivity at high electric field and provided with at least two ohmic bias electrodes, comprising the step of applying a magnetic field to said semiconductor.

14. A logical operation system comprising at least one bulk semiconductor provided with at least two ohmic electrodes and having a negative differential conductivity, means for generating a high electric field domain in said semiconductor, capacitive electrode means for extinguishing said high electric field domain and means for detecting said high electric field domain, said system performing a modification of Sheffer's Stroke ($x \cdot \bar{y}$) of two signals ($x$, $y$).

15. A high speed carry system comprising a bulk semiconductor having a negative differential conductivity, means for generating a high electric field domain in at least a portion of said semiconductor by applying an external signal, capacitive electrode means for extinguishing or sustaining said high electric field domain by another external signal and means for detecting the presence of said high electric field domain at a certain location, said system performing a carry binary addition operation.

16. A logical operation system comprising a bulk semiconductor having a negative differential conductivity and provided with two ohmic bias electrodes, two capacitive electrodes disposed on the side of said semiconductor, means for providing electric signals to said two capacitive electrodes and means for detecting the presence or absence of said high electric field domain in said semiconductor, said system performing an EXCLUSIVE OR of said electric signals.

17. A logical operation system comprising a bulk semiconductor having a negative differential conductivity, capacitive electrode means for generating or extinguishing each of at least two high electric field domains in at least two travelling regions of said domains by an independent signal respectively, and means for detecting the electric current flowing through each said region, said system performing an EXCLUSIVE OR of said signals.

18. A logical operation system comprising a bulk semiconductor having a negative differential conductivity and provided with two ohmic electrodes, means for generating a high electric field domain in said semiconductor by an external signal, capacitive electrode means for sustaining said high electric field domain in said semiconductor by another external signal, and means for detecting the presence of said high electric field domain in said semiconductor, said system performing a logical product of said signals is obtained.

19. A method of generating a plurality of high electric field domains in a bulk semiconductor having a negative differential conductivity, by disposing at least one dielectric material having a capacitive effect on the surface of said semiconductor to thereby bring at least two high electric field domains into co-existence.

20. A method of claim 19 wherein the dielectric material having a capacitive effect is a metal disposed over an insulating material.

21. A method of generating a plurality of high electric field domains in a bulk semiconductor as set forth in claim 19, wherein a permittivity of said dielectric capacitive member is higher than that of said semiconductor.

22. A logical operation system comprising a bulk semiconductor provided with two ohmic electrodes and having a differential negative conductivity at high electric field, and capacitive electrode means for extinguishing a high electric field domain in said semiconductor by means of an external signal.

23. A logical operation system comprising two bulk semiconductors each provided with two ohmic electrodes and having a differential negative conductivity at high electric field, and means for extinguishing high electric field domains in said semiconductors by means of external signals, wherein an output of the first semiconductor due to the presence of a high electric field domain in said first semiconductor is applied to a control means of the second semiconductor to thereby obtain a logical product of said signals.

24. A high speed carry system comprising at least two bulk semiconductors having a negative differential conductivity and provided with two ohmic electrodes, means for generating a high electric field domain, means for controlling said high electric field domain, and means for detecting said high electric field domain, said bulk semiconductors being connected in parallel with each other, and a D.C. power supply connected across said ohmic electrodes of said semiconductors, wherein an output of said means for detecting said high electric field domain in the first semiconductor is applied to said means for generating said high electric field domain of the second semiconductor to thereby perform a carry in a binary addition operation.

25. A high speed carry system comprising at least two bulk semiconductors each having a negative differential conductivity and provided with two ohmic anode and cathode electrodes, means for generating a high electric field domain in said semiconductor, means for controlling said high electric field domain, and means for detecting said high electric field domain, inductances connected in series to said semiconductors, a D.C. power supply connected in parallel with said semiconductors through said inductances and at least one capacitor connected between said anode of the first semiconductor and said cathode of the second semiconductor whereby said high electric field domain can be made to travel in series manner through said semiconductors.

26. A code converter system, comprising at least one branched bulk semiconductor having a negative differential conductivity at high electric field provided with at least three ohmic electrodes, at least one means for generating a high electric field domain, at least two means for detecting a high electric field domain and at least two capacitive electrode means for sustaining or extinguishing a high electric field domain, the branch through which the high electric field domain propagates and subsequently detected by the detecting electrode being determined by applying signal voltages to said sustaining or extinguishing means.

* * * * *